(12) United States Patent
Baumgartner et al.

(10) Patent No.: US 8,245,166 B2
(45) Date of Patent: Aug. 14, 2012

(54) OPTIMAL CORRELATED ARRAY ABSTRACTION

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 12/871,962

(22) Filed: Aug. 31, 2010

(65) Prior Publication Data

US 2012/0054701 A1 Mar. 1, 2012

(51) Int. Cl.
*G06F 17/50* (2006.01)
(52) U.S. Cl. ...................................... 716/111
(58) Field of Classification Search .......... 716/100, 716/111
See application file for complete search history.

(56) References Cited

U.S. PATENT DOCUMENTS

| 7,055,118 | B1 * | 5/2006 | Kamepalli et al. ............ 716/107 |
| 7,370,292 | B2 | 5/2008 | Baumgartner et al. | |
| 2008/0229263 | A1 * | 9/2008 | Baumgartner et al. ........... 716/5 |
| 2008/0270086 | A1 * | 10/2008 | Baumgartner et al. ........... 703/1 |
| 2011/0271243 | A1 * | 11/2011 | Baumgartner et al. ....... 716/106 |

OTHER PUBLICATIONS

Bjesse, Per, "Word-Level Sequential Memory Abstraction for Model Checking", International Conference on Formal Methods in Computer Aided Design, 2008, 9 pages.

* cited by examiner

*Primary Examiner* — Suchin Parihar
(74) *Attorney, Agent, or Firm* — Stephen J. Walder, Jr.; Matthew B. Talpis

(57) ABSTRACT

Mechanisms are provided for refining an abstraction of a netlist for verification or synthesis of an integrated circuit design. The mechanisms receive an abstracted netlist corresponding to an original netlist of the integrated circuit design. The mechanisms determine elements already present in the abstracted netlist and refine the abstracted netlist by expanding the abstracted netlist to include additional elements that are correlated with the elements already present in the abstracted netlist to thereby generate a refined abstracted netlist. In addition, the mechanisms utilize the refined abstracted netlist to perform at least one of verification or synthesis of the integrated circuit design.

22 Claims, 7 Drawing Sheets

OPTIMAL CORRELATED ARRAY ABSTRACTION

BACKGROUND

The present application relates generally to an improved data processing apparatus and method and more specifically to mechanisms for performing optimal correlated array abstraction.

Contemporary hardware designs are often of substantial complexity, comprising a diversity of bit-level control logic, data paths, and performance-related artifacts including pipelining, multi-threading, out-of-order execution, and power-saving techniques. Memory arrays are ubiquitous in hardware designs, representing caches, main memory, lookup tables, and the like. Memory arrays may be used to either implement control logic or data paths.

Due to the complexity of hardware designs, verification, i.e. assessing that a design to be fabricated behaves as intended, performing equivalence checking to validate that two versions of a design (e.g., pre-synthesis and post-synthesis versions of a design) behave identically, and the like, is becoming an increasingly challenging and critical problem. Formal and semi-formal verification techniques are power tools for the construction of correct logic designs. These verification techniques have the power to expose even the most probabilistic uncommon scenario that may result in a functional design failure and ultimately have the power to prove that the design is correct, i.e. that no failing scenario exists. Unfortunately, formal verification techniques require computational resources which are exponential with respect to the size of the design under verification. Semi-formal verification techniques leverage formal algorithms to larger designs by applying them only in a resource-bounded manner, though at the expense of incomplete verification coverage.

The logic around the data flow in a design often contains the most subtle flaws. However, the data flow itself, including the arrays of state elements, e.g., memory arrays, often dominates the size of the design under verification. Because verification requires exponential resources with respect to design size, the data flow poses a tremendous bottleneck which often necessitates manual guidance of the verification process, e.g., to simplify or decompose the overall verification process, to expose these flaws and ultimately establish overall correctness of the design.

Various techniques to "abstract" a design under verification have been proposed. For example, the technique described in Baumgartner et al., U.S. Pat. No. 7,370,292, looks for gates within a design which are irrelevant to a verification problem and hence, may be replaced by non-deterministic values. The technique described in Bjesse, "Word-Level Sequential Memory Abstraction for Model Checking," International Conference on Formal Methods in Computer-Aided Design, 2008, attempts to simplify arrays themselves by modeling a small number of "symbolic" rows to precisely capture write/read data consistency to the modeled rows, and non-deterministically resolving reads to unmodeled rows. In doing so, the technique of Bjesse effectively abstracts relative to "accesses" of the array, i.e. particular read operations which occur relative to a potential property failure.

Such abstractions may dramatically simplify the complexity of the overall verification problem in automatically reducing the size of the design under verification and eliminating the overhead of the data paths. However, such techniques have a substantial drawback in that they abstract arrays and array accesses independently from each other. This often entails a substantial penalty when attempting such abstraction on verification problems where arrays are correlated, a penalty that often leads to practical inapplicability of these techniques to designs having correlated arrays. Furthermore, such techniques tend to abstract arrays in an ad-hoc manner, without considering the impact of the chosen abstraction on subsequent verification complexity. This tends to be suboptimal, as when abstracting arrays, the particular chosen abstraction may have a substantial impact on how efficiently the resulting abstracted array may be represented for subsequent verification.

SUMMARY

In one illustrative embodiment, a method, in a data processing system, is provided for refining an abstraction of a netlist for verification or synthesis of an integrated circuit design. The method comprises receiving an abstracted netlist corresponding to an original netlist of the integrated circuit design. Moreover, the method comprises determining elements already present in the abstracted netlist. Furthermore, the method comprises refining the abstracted netlist by expanding the abstracted netlist to include additional elements that are correlated with the elements already present in the abstracted netlist to thereby generate a refined abstracted netlist. In addition, the method comprises utilizing the refined abstracted netlist to perform at least one of verification or synthesis of the integrated circuit design.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
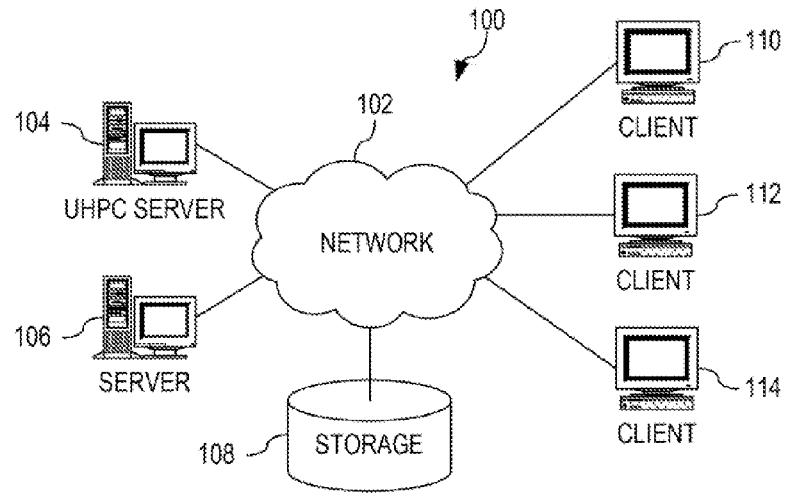
FIG. 1 is an example diagram of a distributed data processing system in which aspects of the illustrative embodiments may be implemented.

The illustrative embodiments provide a mechanism for performing optimal correlated array abstraction. The illustrative embodiments overcome the limitations of known techniques by optimally exploiting correlation of arrays and array accesses when abstracting arrays. Furthermore, the illustrative embodiments provide a method of abstracting arrays in a more optimal manner, enabling more efficient representations of the abstracted arrays. The resulting capacity increase enabled by the techniques of the illustrative embodiments is of central importance to the scalability of functional verification as well as equivalence checking. Additionally, formal reasoning is often central to logic synthesis tools used to optimize logic to be fabricated and thus, the mechanisms of the illustrative embodiments substantially improve the scalability and optimality of synthesis solutions.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
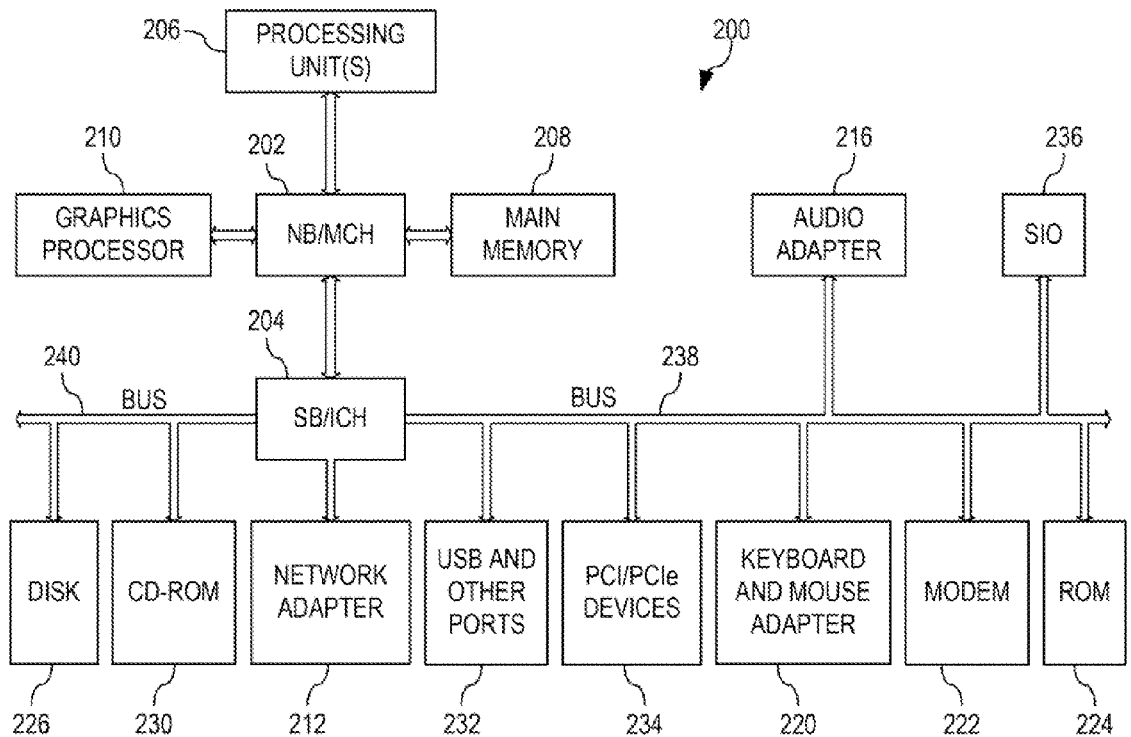
FIG. 2 is a block diagram of an example data processing system is shown in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System P® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
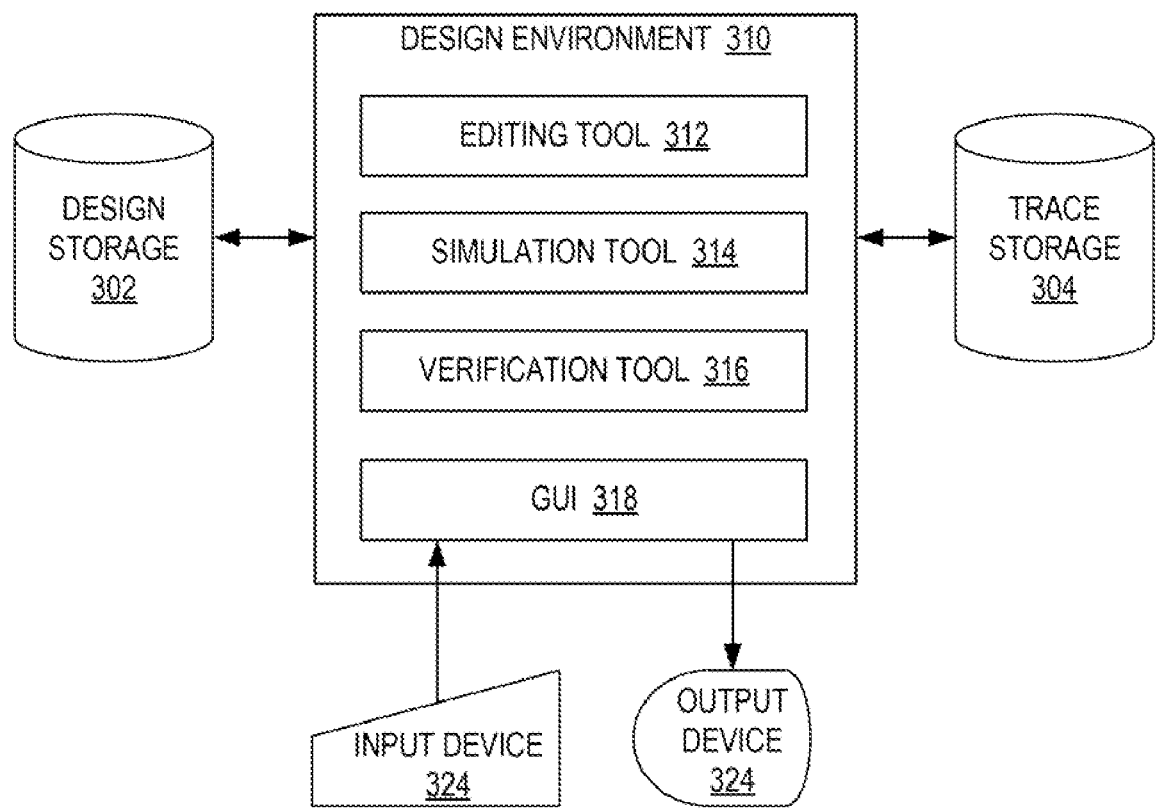
FIG. 3 is a block diagram illustrating an example design environment in accordance with an illustrative embodiment.

One or more of the computing devices, e.g., server computing devices 104 or 106, client computing devices 110, 112, or 114, storage device 108, computing device 200, and the like, may provide a design environment in which an integrated circuit device may be designed, simulated, and verified. FIG. 3 is a block diagram illustrating an example design environment in accordance with an illustrative embodiment. It should be appreciated that the elements shown in FIG. 3 may be implemented in hardware, software, or any combination of hardware and software. For example, the design environment 310 and its associated tools may be implemented as software instructions executing on one or more processors of one or more data processing or computing devices. Moreover, the design storage 302 and trace storage 304 may be storage devices and their associated software, which may be in the same or a different data processing or computing device from that in which the design environment 310 is provided. Furthermore, while the input device 322 and output device 324 are shown as providing input and output directly to/from the design environment, in some illustrative embodiments, the input device 322 and output device 324 may be associated with a separate data processing or computing device which acts as an intermediary between the input device 322 and output device 324, and the data processing or computing device in which the design environment 310 is provided.

When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototypes control and decision structures in flowchart applications or enters them in a state-diagram editor. The process of writing the HDL description is highly dependent on the nature of the circuit and the designer's preference for coding style.

Design environment 310 may include editing tool 312, simulation tool 314, verification tool 316, and graphical user interface (GUI) 318. A circuit designer may create and edit an integrated circuit (IC) design, which may be written in a high-level HDL, such as VHSIC or Verilog, and store the IC design in design storage 302. The circuit designer may interact with editing tool 312 via graphical user interface (GUI) 318 using input device 322 and output device 324, for example.

Simulation tool 314 simulates operation of an IC circuit from design storage 302. The designer may control simulation tool 314 via GUI 318 using input device 322 and output device 324. Simulation tool 314 stores trace results in trace storage 304. Simulation tool 314 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 314 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 310.

Verification tool 316 allows the designer to verify an IC design from design storage 302. A manufacturer may establish and maintain procedures for verifying an IC design. Design verification confirms that the design output meets the design input requirements. Verification tool 316 compares design outputs to design input requirements to determine whether the requirements have been met. The designer may control verification tool 316 via GUI 318 using input device 322 and output device 324. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

Verification tool 316 may operate on a netlist representation of the IC design from the design storage 302. A netlist contains a directed graph with vertices representing gates and edges representing interconnections between those gates. The gates have associated functions, such as constants, primary inputs (hereafter referred to as RANDOM gates), combinational logic such as AND gates, simple sequential elements (hereafter referred to as registers), and memory arrays. Registers have two associated components: their next-state functions and their initial-value functions. The netlist represents both components as other gates in the graph. Semantically, for a given register, the value appearing at its initial-value gate at time "0" ("initialization" or "reset" time) is applied as the value of the register itself; the value appearing at its next-state function at time "i" is applied to the register itself at time "i+1".

Memory arrays represent two-dimensional grids of registers, arranged as rows vs. columns. A circuit reads or writes the contents of memory arrays via dedicated "ports" of three types: read ports, initialization ports, and write ports. Ports of these three types have three components: an address, a data vector, and an enable. The address indicates which row is to be accessed. The enable indicates whether or not the given port is being accessed. The data vector indicates what value is to be written to the given row (if enabled) in the case of a write port or the contents present for the given row of an enabled read. Initialization ports are specialized write ports that are relevant only at time 0.

Memory arrays have a pre-defined number of rows and columns, a default initial value (in case of an unwritten row is read), and an indication of read-before-write vs. write-before-read behavior. The latter is relevant in case of a concurrent read and write to the same address: read-before-write will not return the concurrent write data, whereas write-before-read will. The memory array will often conservatively randomize data contents of a read port in case the read enable is not active, or in case the read row is "out-of-bounds," i.e. the read address is larger than the pre-defined number of rows for the array. Write ports and initialization ports have a pre-defined precedence defining which values will persist in case of multiple concurrent writes or initializations to the same address. Port precedence is irrelevant for read ports; every concurrent read to a given address returns the same data, which is the highest-priority concurrent write to the given address in the case of write-before-read if any such writes exist, else the highest-priority most recent write to that address if any exist, else the highest-priority initialization to that address if any such initialization ports exist, else the default initial value. Each "bit" of a port is referred to as a "pin"—e.g., there is one pin for each enable, and a pre-defined number of data pins (one per "column") per port, as well as a pre-defined number of address pins (usually the base-2 logarithm of the number of "rows" so that each row may be distinctly addressed) per port.

Memory arrays are sometimes bit-blasted into a semantically-equivalent set of registers and combinational logic for verification and synthesis. However, as discussed hereafter, this bit-blasting often introduces unacceptable overhead with regard to the scalability of downstream verification or synthesis applications. Thus, it is highly desirable to retain memory arrays intact with minimal, if any, bit-blasting of the memory arrays.

Certain gates in a netlist are labeled as "targets." Targets correlate to the properties one wishes to verify; the goal of the verification process is to find a way to drive a "1" to a target node (and to generate a "trace" illustrating this scenario if one is found), or to prove that no such assertion of the target is possible.

As mentioned above, verification resource utilization increases exponentially with an increase in the IC design complexity. As a result, an IC design is often abstracted so as to reduce the size of the IC design and thereby reduce the amount of resources necessary to perform verification and synthesis of the design. Examples of abstraction techniques include those described in U.S. Pat. No. 7,370,292 and in Bjesse, "Word-Level Sequential Memory Abstraction for Model Checking." With the technique described in U.S. Pat. No. 7,370,292, a design is reduced in size by replacing certain gates by RANDOM gates. This process is termed "cutpointing." This often dramatically reduces netlist size by allowing other gates to fall out of the "cone of influence" of the targets.

The abstraction technique described in Bjesse bit-blasts a memory array into a small set of "symbolic rows." This set of "symbolic rows" often begins empty, and rows are added during refinement in response to spurious failures. In addition to modeling data contents for represented rows, the addresses correlating to the modeled rows are represented using randomly initialized registers. Reads and writes to modeled rows are performed precisely, whereas writes to unmodeled rows are ignored and reads from unmodeled rows return randomized data. To prevent trivial failures merely due to reading unmodeled rows, "antecedent conditioning" of targets is performed. That is, given a spurious counter-example caused by a read from port R_i which occurred k timesteps prior to the failure, resulting in a new row being modeled with symbolic address r_i^k, target "t" is replaced by "(previous^k (R_i.a==r_i^k)) implies p." The notation "previous^k" refers to the condition in parenthesis (R_i.a==r_i^k) being true k timesteps previously.

Figure 4:
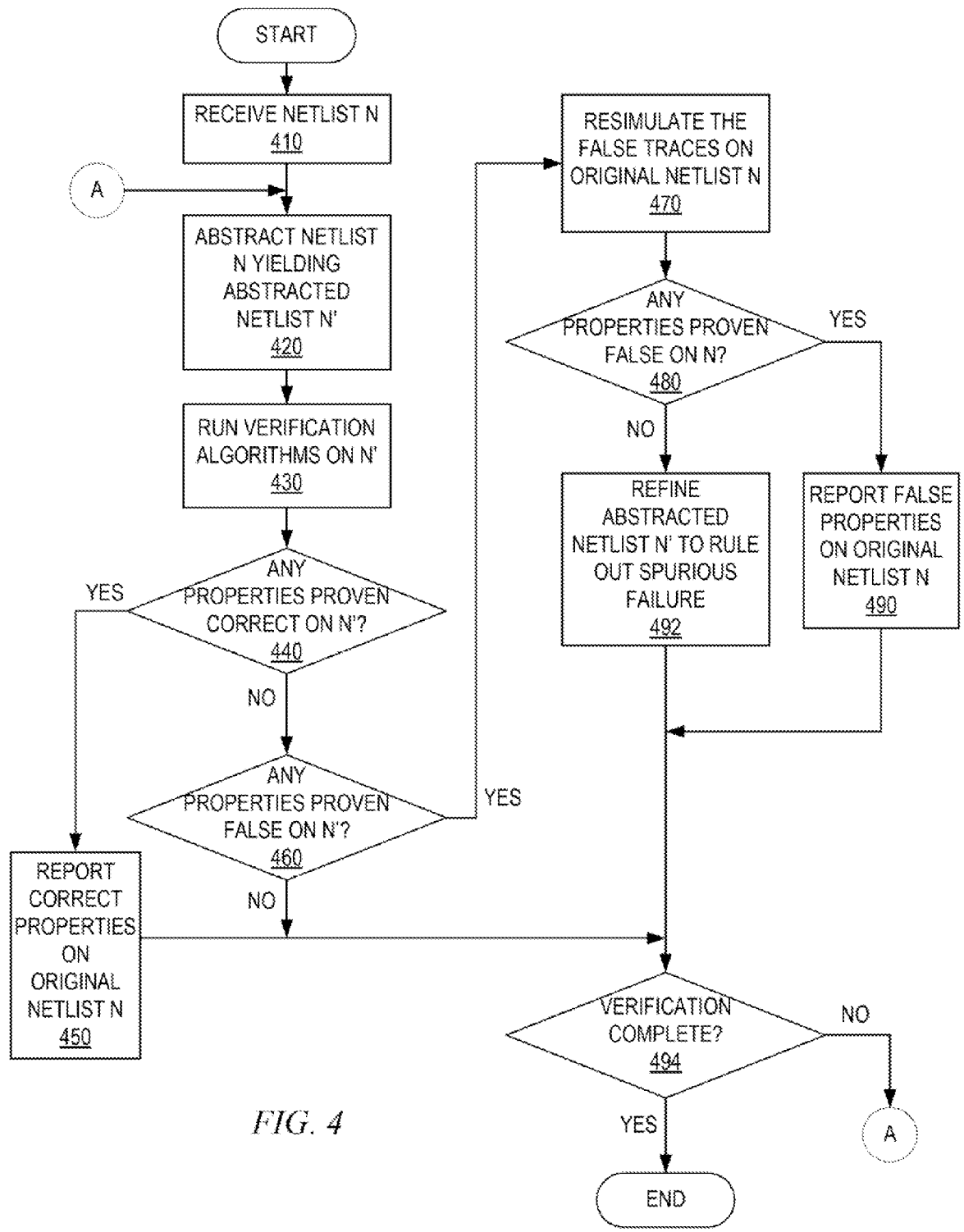
FIG. 4 is an example diagram illustrating an abstraction-refinement scheme that may be implemented by a verification tool.

FIG. 4 is an example diagram illustrating an abstraction-refinement scheme that may be implemented by a verification tool. As shown in FIG. 4, the operation involves receiving a netlist N (step 410) and abstracting the netlist N, such as by using one of the abstraction techniques mentioned above, to yield abstracted netlist N' (step 420). Verification algorithms are run on the abstracted netlist N' (step 430). A determination is made as to whether any properties are proven correct on the abstracted netlist N', i.e. that the abstracted design operates properly with regard to these properties (step 440). If so, then these properties are reported, such as in a trace file or the like, as correct on the original netlist N (step 450).

A determination is made as to whether any of the properties are falsified on the abstracted netlist N', i.e. that the abstracted design does not operate properly with regard to these properties, (step 460). If so, then the falsification traces, i.e. the traces through the netlist that resulted in the properties not meeting verification requirements, are re-simulated on the original netlist N (step 470).

A determination is made as to whether any properties are falsified in this re-simulation on the original netlist N (step 480). If so, then these failures are reported, such as in a trace file or the like, as failures for the original netlist N (step 490). If there are no falsified properties in the re-simulation on the original netlist N (step 480), then the abstracted netlist N' is refined to rule out the spurious failure identified in step 460 (step 492). A determination is made as to whether the verification is complete (step 494). If not, the operation returns to step 430. Otherwise, the operation terminates.

The actual abstraction algorithm used, e.g., the abstraction algorithm of U.S. Pat. No. 7,370,292 (hereafter referred to as the '292 abstraction technique) or of Bjesse (hereafter referred to as the Bjesse abstraction technique), impacts steps 420 and 492. With the '292 abstraction technique, this would entail first selecting which gates to convert into RANDOM gates in step 420 (termed "cutpointing"), then removing some of those cutpoints in step 492. With the Bjesse abstraction technique, this would entail modeling a small set (perhaps 0) of rows in step 420, then modeling additional rows in step 492. Aside from this distinction, abstraction-refinement routines generally work by abstracting the netlist N (step 420), then attempting to prove or falsify the properties on the abstracted netlist N' (step 430). By the nature of over-approximate abstractions, proofs on the abstracted netlist N' are valid on the original netlist N and thus, may be reported in step 450. Failures may be "spurious" however, i.e. the failures may not hold in the original netlist N due to the nature of the abstraction. Thus, steps 470-492 attempt to assess validity of these abstract failures on the original netlist N. If they are valid, these failures are reported, such as in a trace file or the like. If they are not valid, these failures result in refinement of the abstraction to increase its accuracy so that the refined abstracted netlist N' is not prone to a subsequent identical spurious failure.

One major weakness of traditional abstraction-refinement techniques is that refinements are traditionally performed independently of each other. For example, with the Bjesse abstraction technique, every time it is determined that a new row needs to be modeled due to a spurious failure occurring on an abstracted netlist N', that row is modeled with a new RANDOM address which is independent of other modeled addresses. More specifically, recall that each modeled row is represented using a set of registers to hold the data of the modeled row, as well as a set of randomly-initialized registers to represent the address of the modeled row. Each modeled row has an independent set of randomly-initialized registers to represent its address. Technically, this independence is even mandatory to ensure that the antecedent conditioning of targets is "sound," i.e. will not yield a spurious passing result.

With the '292 abstraction technique, when attempting to decide which array cells to refine, those decisions are made regardless of other decisions. Even for a netlist with a single array, one desirable outcome of the '292 abstraction technique is that it may determine that certain rows or columns may be outright irrelevant to a given target. The array may then be simplified by projecting out those rows or columns as will be detailed with regard to FIG. 6 hereafter. The decisions of which gates, or in the case of a memory array—cells, are to be refined are made independently from each other and often rely upon heuristics to select which gates to refine. Thus, it is often the case that some gates are refined that truly do not need to be. In the context of abstracting arrays, such as memory arrays, a single irrelevant refinement choice may preclude the ability to eliminate a given column or row from the array during abstraction. Thus, additional resources will be needed during verification that might otherwise be saved.

With the Bjesse abstraction technique, even given a netlist N with a single array, e.g., memory array, it may be that the netlist N reads the same arbitrary row twice during the course of evaluation of a property, e.g., one read may be by the netlist N representing the design itself, and another may be due to the "testbench" around the array to assess correctness of the design. These reads may occur at different points in time, requiring two distinct refinements which are modeled using distinct RANDOM addresses. As will be described hereafter, the illustrative embodiments may model both reads using the same address (in particular, the same set of randomly-initialized registers representing the modeled address), reducing the size impact of modeled rows and enabling resources to be saved during verification.

Furthermore, it has been determined that such a lack of explicitly-modeled address correlation due to distinct RANDOM address modeling on the abstracted netlist N', such as in the Bjesse abstraction technique, substantially hurts verification in many other ways. For example, the data being modeled for each refined address loses its correlation along with the lack of explicitly-modeled address correlation. In some cases, such modeled data may be redundant and thus, could be eliminated by optimization algorithms. Such loss in correlation often substantially hurts the effectiveness of subsequent abstraction techniques as well, e.g., applying the '292 abstraction technique after the Bjesse abstraction technique is often ineffective if the application of the Bjesse abstraction technique loses address and data dependencies that otherwise hold.

In equivalence checking, often the designs being equivalence checked have corresponding arrays, i.e. the arrays across both designs have identical reads which occur at the same time to the same addresses, or more generally corresponding reads may occur at different times if the arrays were "retimed" across the two designs. Additionally, the arrays across the two designs may have been address partitioned, i.e. one array with X rows was split into two arrays with X/2 rows. Reads of the X-row array may correlate to reads of the X/2 row arrays under a specific permutation of addresses. It is further noteworthy that these limitations are not unique to equivalence checking. Often, designs have arrays modeled in a way that closely matches the circuit implementation, which may entail fragmenting a "wide" array into numerous "narrower" arrays which are accessed in a correlated manner. The traditional loss of address and data correlation of modeled rows is thus, a substantial performance bottleneck to the scalability of both equivalence checking and more general formal reasoning.

Figure 5:
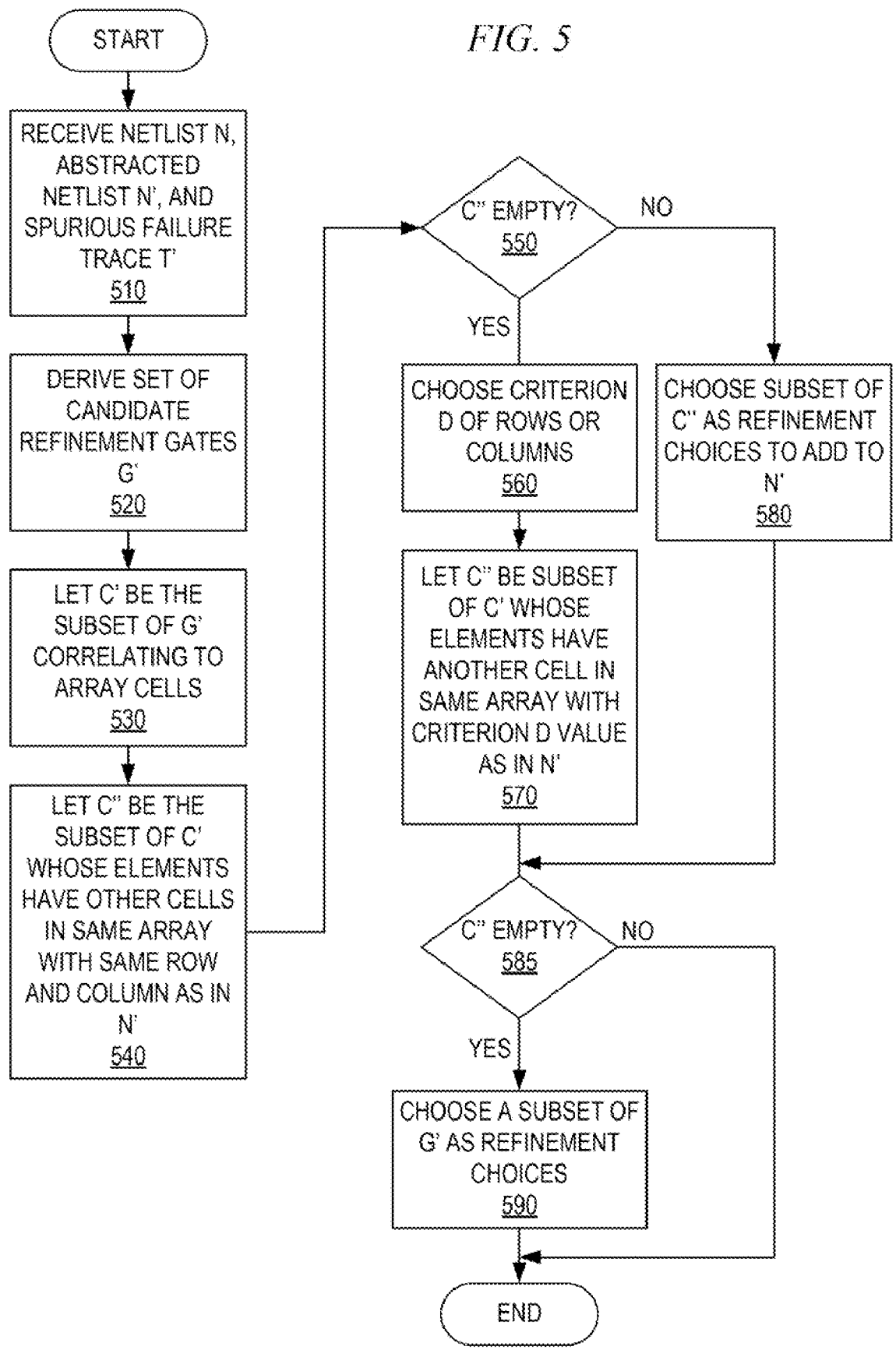
FIG. 5 is an example flowchart outlining an operation for optimally refining arrays using one type of abstraction technique and a refinement extension in accordance with one illustrative embodiment.

The illustrative embodiments operate to perform refinement on abstracted netlists, or models of an IC circuit, by determining how to expand the abstraction by looking at the elements that are already present within the abstracted netlist/model and finding additional elements that have a correlation or relationship with the elements already present in the abstracted netlist/model. In choosing which elements to add to further refine an abstracted netlist or model, the illustrative embodiments first attempt to include additional elements that will not substantially increase the size overhead by including elements having the same row and/or column locations as elements already in the abstracted netlist/model. Portions of the array that are not referenced, i.e. accessed during the verification or synthesis, may be eliminated to render a more compact abstracted array representation, thereby enabling greater efficiency of a subsequent verification process. By selecting refinement gates in a way which minimizes the total number of referenced columns and rows, the current invention thereby significantly improves the capacity of verification solutions FIG. 5 is an example flowchart outlining an operation for optimally refining arrays using the '292 abstraction technique and a refinement extension in accordance with one illustrative embodiment. The operation outlined in FIG. 5 may be performed, for example, by a verification tool 316 or the like, in a design environment, such as design environment 310 in FIG. 3. The operation outlined in FIG. 5 may operate to generate a refined abstracted netlist or model upon which verification and/or synthesis may be performed in order to ensure proper operation of the original netlist or IC design. Thereafter, assuming that the design is verified, the IC design may be used to fabricate an IC device using a fabrication system (not shown) in a manner generally known in the art.

While the mechanisms of the illustrative embodiments will be described in terms of being applicable to memory arrays, the illustrative embodiments are not limited to such. Rather, the mechanisms of the illustrative embodiments may be applied to any array of elements in a model. The model may be of an integrated circuit device, or other type of system that involves an array of elements. Such a system is not limited to electronic or circuit based systems but may include other types of systems including biological systems of arrays of elements, e.g., DNA, biological cells, or the like.

As shown in FIG. 5, the operation starts with receiving an original netlist N, the abstracted netlist N', and a spurious failure trace T' (step 510). The netlist N may be obtained, for example, from editing tool 312 in FIG. 3, a design file or file(s) in design storage 302, or the like. The spurious failure trace T' may be obtained, for example, from a previous attempt to verify the design by the verification tool 316, for example. The spurious failure trace T' may be part of a trace file stored in the trace storage 304, for example.

A set of candidate refinement gates G' is derived (step 520). This set may be derived in any arbitrary manner. For example, G' may be assigned to be the set of cutpointed gates assigned a Boolean value in trace T', noting that some verification algorithms which may be used to derive a trace minimally-assign gates to keep the trace as small as possible hence this set G' may already be a set of good candidates. Generally, the set of cutpoints assigned in trace T' is an upper-bound on the set of gates G' to be considered for refinement; it may be a subset using heuristic approaches such as "the set of gates which are assigned to Boolean values for the greatest number of time-frames within T'," or it may be subset using algorithmic approaches such as systematically flipping the Boolean value of each cutpoint assignment, resimulating the behavior of the abstract netlist under that flipped value and if the resimulation again triggers a spurious failure, removing that unnecessary assignment from T' to in turn preclude that gate from being a candidate in G'. A subset C' of the candidate refinement gates G' is identified that correlates to array cells (step 530); recall that the netlist format defines a "type" to each gate, hence it is straight-forward to identify this subset C' of G'. A subset C" of the array cells in subset C' is identified such that each element c" in the subset C" has other cells in the same array with the same row and the same column as the element c" in the abstracted array N' (step 540).

In particular, let A' represent the set of array cells included in the abstracted array N'. C" represents cells of C', such that every c" in C" (which has row r_c" and column c_c") has some other cell a' in A' with the same row r_c", and yet another cell b' in A' with the same column c_c". Note that a' and b' must be distinct gates, else they would be the same as c" hence would not be refinement candidates as they already would be in the abstract netlist. Such cells are ideal candidates to use for refinement, as their inclusion does not introduce any new columns or rows into the resulting refined abstract netlist.

A determination is made as to whether C" is empty (step 550). C" would be empty if for each refinement candidate cell c' in C', the set A' of array cells included in the abstracted array N' do not include any pair of elements one with the same row, and one with the same column, as c'. If C" is empty, the operation chooses a criterion D of either "rows" or "columns" (step 560). This criterion may be randomly chosen, or systematically: e.g., first "rows" is chosen, and if this choice is deemed of no use (e.g., the resulting subset C" in step 570 is again empty), the other criterion may be chosen. The subset C" is generated that is a subset of C', i.e. elements c", such that each element c" has another cell in the same array with the same criterion D value as c" in the abstracted array N' (step 570). If C" is not empty (step 550), a subset of C" is chosen as a refinement choice to add to N' (i.e. cutpoints to eliminate from the abstracted array N'). This subset may be the entire set C", or it may be pruned using an arbitrary mechanism as described above: heuristically based upon the cutpoints which were assigned the most number of time-frames in T', or algorithmically by assessing if undoing that specific assignment (flipping its value in T') still results in a spurious failure. Else, if neither step 540 nor 570 yield a non-empty set C" (step 585) (as would happen if the set of cells A' already modeled in N' is empty), a subset of G' is chosen as refinement choices (step 590) and the operation terminates.

A traditional approach to refining an abstracted netlist N' generated using the '292 abstraction technique would only include steps 510, 520, and 590. However, with the mechanisms of the illustrative embodiments, when needing to choose among array cells that are relevant to the refined netlist N', the illustrative embodiments first attempt to choose those which do not entail any substantial size overhead to the localized array. That is, in step 540, preferably those array cells which already match rows and columns included in the abstracted netlist N' are used to refine the abstracted netlist N'. Otherwise, the array cells that match an existing row "or" column, are chosen, as in steps 550-570. The impact of this choice in yielding an optimally reduced array is as follows.

Any columns which are not referenced in an array may be projected out of that array, i.e. if the array has 10 columns (0 . . . 9) and column 5 is not relevant to a verification task, the illustrative embodiments may reduce that array to 9 columns (0 . . . 4 and 6 . . . 9) without changing the semantics of the overall verification problem. If any rows are not referenced, the illustrative embodiment may optimize the design in one of several ways. First, if a range of rows are not relevant it is possible that an address pin of the array may actually be reduced. For example, if no even row in an array is relevant, the illustrative embodiments may drop the least-significant address pin from that array as follows. For each port, the illustrative embodiment may conjunct (i.e. perform a logical AND operation) that least-significant address bit to the port's enable pin. This will ensure that, if an even row is accessed on the resulting netlist (that least-significant address bit evaluates to zero), the corresponding read or write will not access the array contents: the resulting conjuncted enable pin would evaluate to zero to preclude such access, since the even-row address would correlate to an evaluation of the least-significant address pin to zero. The least-significant bit of the address pins per port may then be eliminated from the array syntax as irrelevant.

It should be appreciated that a port has several components, e.g., an enable, address, and data component. A logical gate can be created that checks whether an address appearing at a given port evaluates to one of the relevant rows: basically, by creating a gate for each relevant row which checks whether the address of the given port matches that row, and ORing across each such gate. More specifically, given a set of relevant addresses {a0, a1, a2, . . . , aj}, the gate which checks whether the address appearing at a given port evaluates to one of the relevant rows is of the form "(address==a0) OR (address==a1) OR (address==a2) . . . OR (address==aj)". Once such a logical gate is created, it may be conjuncted to the enable pin of the port and the resulting conjunction can be defined as the new enable for that port. This transformation may be done on a per-port basis since each port has a distinct enable, address, and data component set, and effectively prevents the given port from accessing an irrelevant row.

Second, it may be the case that an individual set of rows is irrelevant, but this set of rows is insufficient to directly eliminate an address pin. For example, given a four-row array with two address pins per port, perhaps rows 0 and 3 are relevant; neither of the two address pins may be tied to a constant in this case to limit access to the relevant rows, as both address pins need to evaluate to both zero for one relevant row (0) and to one for the other relevant row (3). A determination of whether an address pin may be eliminated as per the prior case may be performed using straight-forward analysis: for each address pin, assess whether all relevant rows refer to that address pin as having the same Boolean value. If so, the prior transformation may be used to eliminate that address pin. If not, the following approach may be used to enable a reduction. If the number of relevant rows (total array rows minus the irrelevant set of rows) is half or less of 2 to the power of the number of address pins, the illustrative embodiments may reduce its number of address pins by permuting its address space to "pack" the remaining relevant rows.

This process consists of forming a bijection, i.e. a 1:1 mapping, between original relevant rows and post-abstraction rows. This mapping is formed by enumerating the relevant rows: assume this is a set {a0, a1, a2, . . . , a{j−1}, aj}. The i'th element ai of this set will correlate to the post-abstraction row "i", such that original address ai maps to post-abstraction row "i". For each array port, the illustrative embodiments synthesize this bijective relation to map original addresses to post-abstract evaluations, straight-forwardly synthesizing the relation "postAbstractAddress=if (originalAddress==a0) then 0 else if (originalAddress==a1) then 1 else if (originalAddress==a2) then 2 . . . else if (originalAddress==a{j−1}) then {j−1} else j." The resulting postAbstractAddress may be used as the address pins of the corresponding array, and its enable may be conjucted to the condition that the original address matched one of the relevant rows as was done before. Because it has been determined that the number of relevant rows is half or less of 2 to the power of the number of original address pins, this approach enables the post-abstract array to have fewer address pins than the original array since the greatest post-abstraction row that needs to be addressed is j, which may be a much smaller number than aj—and the number of post-abstraction address pins may be kept minimally-sized.

Third, if any rows are irrelevant, yet the illustrative embodiments cannot reduce the address space using one of the above two techniques, the illustrative embodiments may nonetheless, on a per-port basis, synthesize the condition that a relevant address is being accessed and conjunct that condition onto the enable of the irrelevant rows. This process may simplify verification, as it may be used to prevent the interpretation (or possible bit-blasting) of any irrelevant rows, in particular, a verification algorithm such as "simulation" which would record values written to an array for subsequent reads would no longer have the overhead of recording values written to irrelevant rows: such writes that may occur in the original netlist would have their enables de-asserted in the transformed netlist. Furthermore, a simple logical query may be used when bit-blasting to check whether a set of registers being synthesized to represent a given row may ever be read—i.e., a "satisfiability" query using formal reasoning may check whether any read port may ever reference this set of registers. This query would return false for an irrelevant row after this transformation (but not before)—since the read enables would always be de-asserted if the address evaluates to an irrelevant row. The overall optimization of the refinement of an abstraction, as applied to the '292 abstraction technique, in accordance with one illustrative embodiment, is outlined in FIG. 6.

Figure 6:
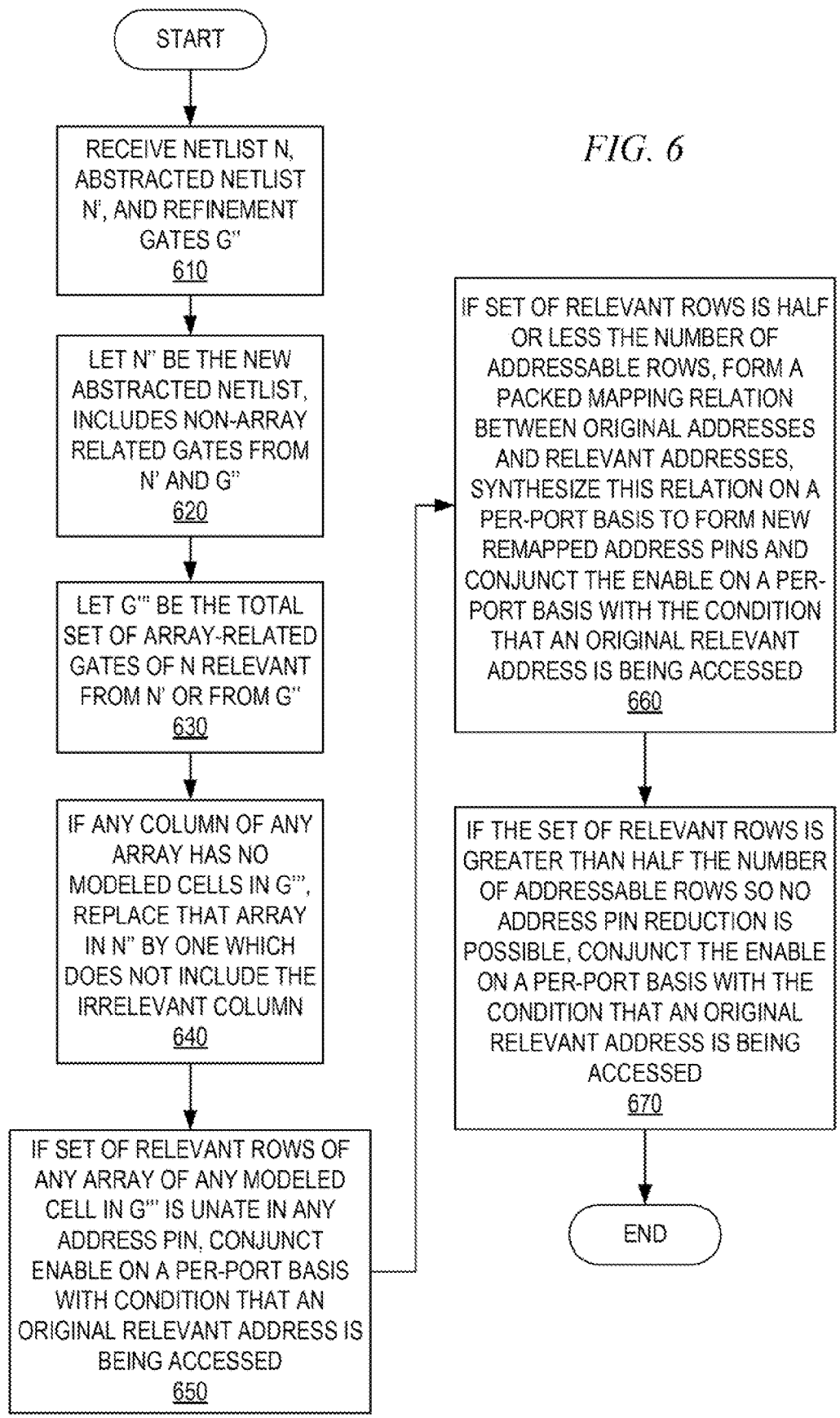
FIG. 6 is a flowchart outlining a localization abstraction operation in accordance with one illustrative embodiment.

FIG. 6 is a flowchart outlining a localization abstraction operation in accordance with one illustrative embodiment. As shown in FIG. 6, the operation starts by receiving an original netlist N, an abstracted netlist N', and a set of refinement gates G" (step 610). As mentioned above, the original netlist N may come from an editing tool 312 or may otherwise be stored in a design storage 302. The abstracted netlist N' may be obtained from abstracting the original netlist N using one of the abstraction techniques described above, e.g., the '292 abstraction technique. The refinement gates G" refers to a set of arbitrarily chosen gates to refine and may be, for example, the final set of gates chosen as a result of the operation outlined in FIG. 2 above, for example.

A new abstracted netlist N" is created which starts with only non-array related gates from the abstracted netlist N' and the set of refinement gates G" (step 620). A set G'" is created to represent the remainder of N' and G": the total set of array cells, of the original netlist N, that are already included in the abstracted netlist N', or within the set of refinement gates G" (step 630). Note that N' and G" are disjoint: if a gate is already in the abstract netlist N' it would not be a refinement candidate in G". Of course some gates may be in neither N' or G". These are gates which will not be in the refined abstract netlist. This observation is central to the reason that abstraction reduces verification resources.

Recall that every array cell c' correlates to given row r_c' and column c_c'. If any column of any array has no modeled cells in G'", that array in the new netlist N" is replaced by one which does not include the irrelevant column (step 640) This is accomplished by instantiating an array with a smaller set of columns than the original array, in particular with fewer data pins per port. If e.g. column 5 of a 10-column array is irrelevant, we will instantiate a 9-column array, and re-connect the signals connected to original data pins 0 . . . 4 to reduced data pins 0 . . . 4, and re-connect the signals connected to the original data pins 6 . . . 9 to reduced data pins 5 . . . 8. If the set of relevant rows of any array of any modeled cell in G'" is unate in any address pin, i.e. setting a given address pin to a given constant (independent of the other address pins) cannot access any of these relevant rows, the enable of each portion is conjuncted (i.e. logically AND'd) with the relevant unate polarity of that address pin, and that pin is projected out of the vector of address pins as described (step 650). The term "unate" is a standard term from the field of logic synthesis that means "referred to in only one polarity: uninverted or inverted." In the present context, "unate" means that for a given address pin, all rows from G" are sensitized by that address pin being a single polarity, e.g., if all rows in G" are even, the least significant address bit would be unately referenced as inverted (==0). If all rows in G" are odd, the least-significant address bit would be unately referenced as being uninverted (==1).

If the set of relevant rows is half or less the number of addressable rows (which is 2 to the power of the number of address pins per port), a "packed" mapping relation between original addresses and relevant addresses is. For example, consider a set of relevant addresses {a0, a1, a2, . . . , aj}. If all addresses are relevant, {a0, . . . , aj} will be {0 . . . #rows-I}, i.e. no reduction is possible since all rows are referenced. If not, the "packed relationship" is formed by mapping abstracted row 0 to whatever i0 happens to be, abstracted row 1 to whatever i1 happens to be, etc. as described above. For example, i0 could refer to address 100 of the original netlist and this would be mapped to abstracted row 0. Similarly, i1 could refer to address 333 of the original netlist and this would be mapped to abstracted row 1.

The "packed" mapping relation is synthesized on a per-port basis to form new remapped address pins (which have fewer bits than before), and the enable is conjuncted on a per-port basis with the condition that an original relevant address is being accessed (step 660). If the set of relevant rows is greater than half the number of addressable rows, so no address pin reduction is possible, the enable is conjuncted on a per-port basis with the condition that an original relevant address is being accessed (step 670). The operation then terminates.

It should be appreciated that through the implementation of the operation outlined in FIG. 6, a more efficient refinement of the abstracted netlist is made possible. For example, the illustrative embodiments improve known refinement mechanisms by the inclusion of steps 640-670 in FIG. 6.

Figure 7:
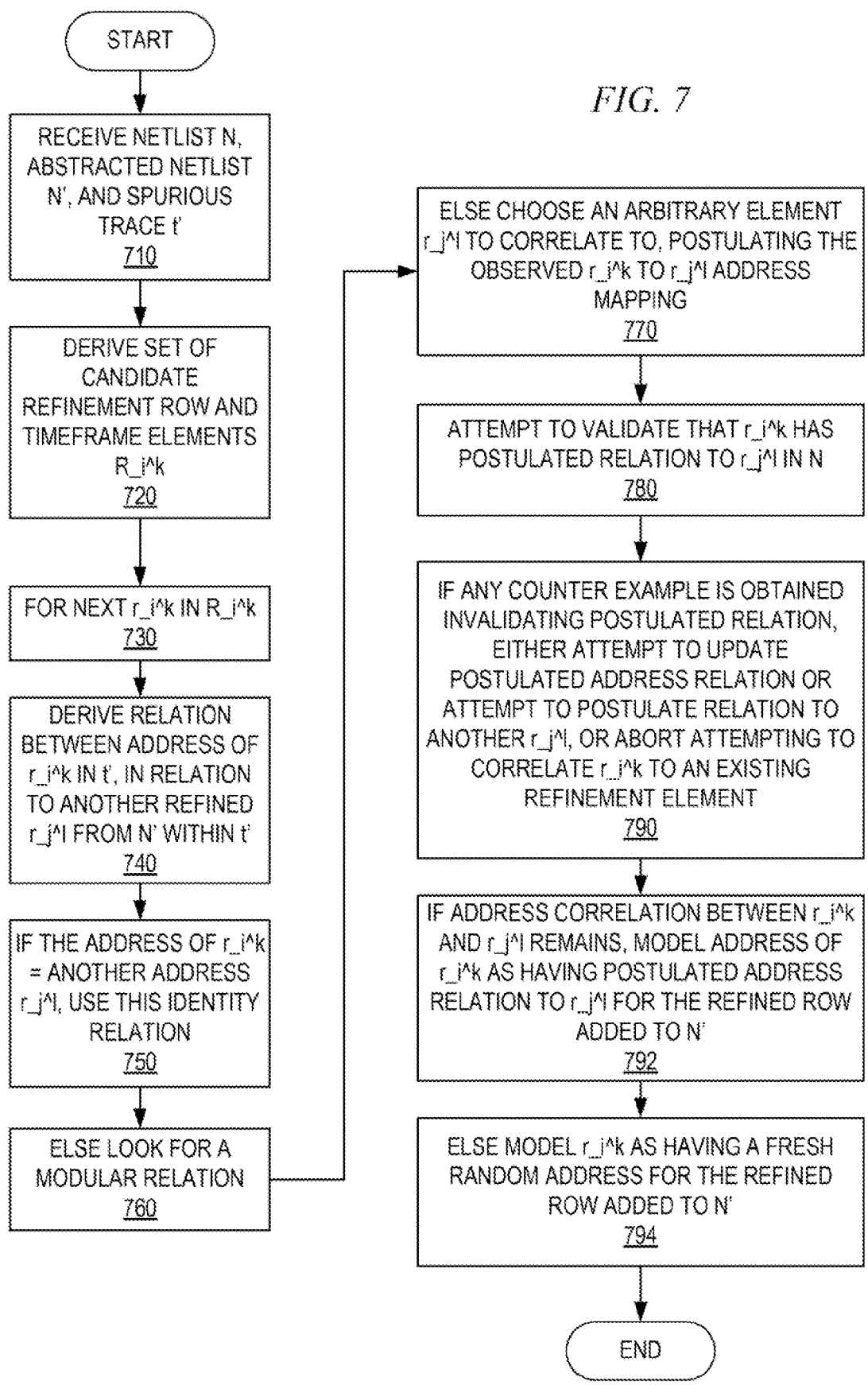
FIG. 7 is a flowchart outlining an example optimization of a Bjesse abstraction technique that is augmented to include the refinement mechanisms in accordance with one illustrative embodiment.

FIG. 7 is a flowchart outlining an example optimization of a Bjesse abstraction technique that is augmented to include the refinement mechanisms in accordance with one illustrative embodiment. As shown in FIG. 7, the operation states by receiving an original netlist N, an abstracted netlist N', and a spurious failure trace t' (step 710). Again, the original netlist N may be obtained from the editing tool 312, design storage 302, or the like. The abstracted netlist N' may be obtained from performing an initial abstraction of the original netlist N, such as by applying the Bjesse abstraction technique discussed above. The spurious failure trace t' may be obtained, for example, from the trace storage 304 and may have been generated based on a prior iteration of the verification tool 316 attempting to verify the design corresponding to the original and abstracted netlists.

A set $R\_i\hat{\ }k$ of candidate refinement rows and timeframe elements $r\_i\hat{\ }k$ is derived (step 720). This may be done in any arbitrary manner. For example, this may be performed by enumerating all enabled in-bound read operations that occur within t' as candidate refinement rows according to the time k between the read occurring and the property failing, then attempting to minimize this set. Minimization may be done by systematically eliminating one element from this candidate refinement set, and checking if simulating the original netlist under trace t' while forcing the data resulting for any read operations included in the candidate refinement step to match that of the abstract trace t'. If the resulting simulation yields a spurious failure, the eliminated candidate refinement is irrelevant and minimization of other elements may be attempted. If the resulting simulation does not yield a spurious failure, the eliminated candidate refinement element is returned to the set as its corresponding read contributes to the failure. The resulting set may be used as $R\_i\hat{\ }k$.

Thereafter, for each $r\_i\hat{\ }k$ in $R\_i\hat{\ }k$, steps 740-770 are performed, as described hereafter (step 730). An attempt to derive a relation between the address of $r\_i\hat{\ }k$ in t' with another previously-refined element $r\_j\hat{\ }l$ from the abstracted netlist N' within t' is made (step 740), namely by comparing the address appearing at $r\_i\hat{\ }k$ in t' vs. the addresses appearing in any modeled rows within t'. Regarding the nature of address relationship sought: often "identity" (equivalence) between the address of a current refinement and that of a previously-modeled row is an adequate relation. Alternatively, we have encountered equivalence checking problems where an array with a large number of rows in one netlist is replaced with multiple arrays of a smaller number of rows in another. In such cases, postulating a correspondence between an address of the larger array to an address "identical modulo the number of rows in the smaller array" is often effective. If the address of element $r\_i\hat{\ }k$ equals another address $r\_j\hat{\ }l$, then this "identity" relationship is used (step 750). If the address of $r\_i\hat{\ }k$ does not equal another address $r\_j\hat{\ }l$, then the operation looks for a modular relation: the array of $r\_i\hat{\ }k$ being some divisor/multiple of the size of another refined array in the abstracted netlist N' or the set of candidate refinement row and timeframe elements $R\_i\hat{\ }k$, and the address of $r\_i\hat{\ }k$ in the spurious failure trace t' being the same divisor/multiple of some element $r\_j\hat{\ }l$ in t' (step 760). If no such "preferred" relationship is found, an arbitrary element $r\_j\hat{\ }l$ is chosen to attempt to form an address correlation with, noting the observed $r\_i\hat{\ }k$ to $r\_j\hat{\ }l$ address mapping from t' (step 770). In steps 770 through 790, it will be attempted to form a mapping between the addresses of $r\_j\hat{\ }l$ and $r\_i\hat{\ }k$. The observed relationship from t' provides one such mapping point; this mapping will be further formed and validated in 780 and 790. Note that this step seeks a more general relationship than identity (750) or modularity (760).

An attempt is made to validate that $r\_i\hat{\ }k$ has the postulated relation to $r\_j\hat{\ }l$ in original netlist N (step 780), and also to form a more complete mapping than is available from 770. This process consists of two steps: first "validating" that the postulated mapping always holds in the original netlist: in particular, using formal verification techniques to confirm that the address at the read port correlating to $r\_j\hat{\ }l$ and that of $r\_i\hat{\ }k$ always evaluate as per the postulated mapping. If not, the second step (790) is to attempt to make the mapping more precise—i.e. to add mappings for addresses which have not yet been witnessed. The failure of the first step will yield another trace t'' (referred to as a "counterexample trace") from which more mapped values may be extracted as was done in 770. However, if a contradiction is witnessed such that t'' would map a given address of $r\_i\hat{\ }k$ which is already mapped to a different address of $r\_j\hat{\ }l$, no correlation is possible hence the process aborts attempting to correlate $r\_i\hat{\ }k$ to an existing refinement element (step 790).

If address correlation between $r\_i\hat{\ }k$ and $r\_j\hat{\ }l$ has been validated (i.e. 790 did not abort), the operation models the address of $r\_i\hat{\ }k$ as having the postulated address relation to $r\_j\hat{\ }l$ for the refined row added to the abstracted netlist N' (step 792). This is done similarly to the process of synthesizing mappings between original netlists and post-abstract netlists in FIG. 6. In particular, instead of synthesizing a set of randomly-initialized registers for the address of the newly modeled row $r\_i\hat{\ }k$, we create logic over the previously-created randomly-initialized registers representing the address of $r\_j\hat{\ }l$ which has the desired mapping. We use the resulting logic as the address correlating to the newly-modeled row for $r\_i\hat{\ }k$, Else, if no correlation has been validated, the operation models $r\_i\hat{\ }k$ as having a fresh address (randomly-initialized set of registers) for the refined row added to the abstracted netlist N' (step 794). The operation then terminates.

A traditional approach to refining a Bjesse abstraction technique would only include steps 710, 720, and 794 from FIG. 7 above. Using an optimization technique in accordance with the illustrative embodiments, instead of outright independently modeling both an address and data pair for each refinement, the illustrative embodiments attempt to derive an address relation for the newly refined row to be added to the abstracted netlist model N', and an already-modeled row, using steps 730-790.

As shown in FIG. 7 above, the operation starts by identifying simple address relations: equality (step 750), or an array-size-related relation (step 760). If this fails, it is possible that the address being modeled is equal to some arbitrary permutation of another address. It should be noted, for example, that in an equivalence checking setting, two arrays would behave identically if all addresses of one were arbitrarily permuted consistently across all read and write ports with respect to another. Steps 770-780 allows the illustrative embodiments to iteratively derive such a relation. Once the address relation has been postulated, steps 780-790 attempt to validate that postulated relation. If this postulated relation fails to hold, the postulation may be updated, changed, or discarded. If any postulated relation remains, in step 790, the illustrative embodiments perform an optimized refinement of $r\_i\hat{\ }k$: the address of the row to be modeled is fixed to be the postulated relation to existing modeled row $r\_j\hat{\ }l$ (this relation can be directly synthesized from the postulated relation), a data vector is introduced to represent the contents of that row, and no antecedent condition of targets is performed for this optimized refinement (else this procedure would not be "sound"—i.e. would risk yielding incorrect "passing" verification results). Else, in step 794, a traditional refinement is performed, including a fresh RANDOM address.

Thus, the illustrative embodiments provide a more intelligent refinement process for refining an abstraction of a netlist or model in the event that a verification tool, synthesis tool, or the like, determines that there is a failure in the abstraction of the netlist or model. The intelligent refinement mechanisms perform refinements based on an analysis of the elements already present in the abstraction and determining additional elements to be added to the abstraction that will result in the least amount of added overhead when performing verification, synthesis, or the like. Thus, an improvement over known mechanisms, that use independent or even random selection of elements during refinement, is achieved by the mechanisms of the illustrative embodiments.

The illustrative embodiments may be used in conjunction with mechanisms for designing and fabricating integrated circuit devices. For example, the mechanisms of the illustrative embodiments may be used to refine netlists or models of an integrated circuit device design when performing verification and/or synthesis.

Figure 8:
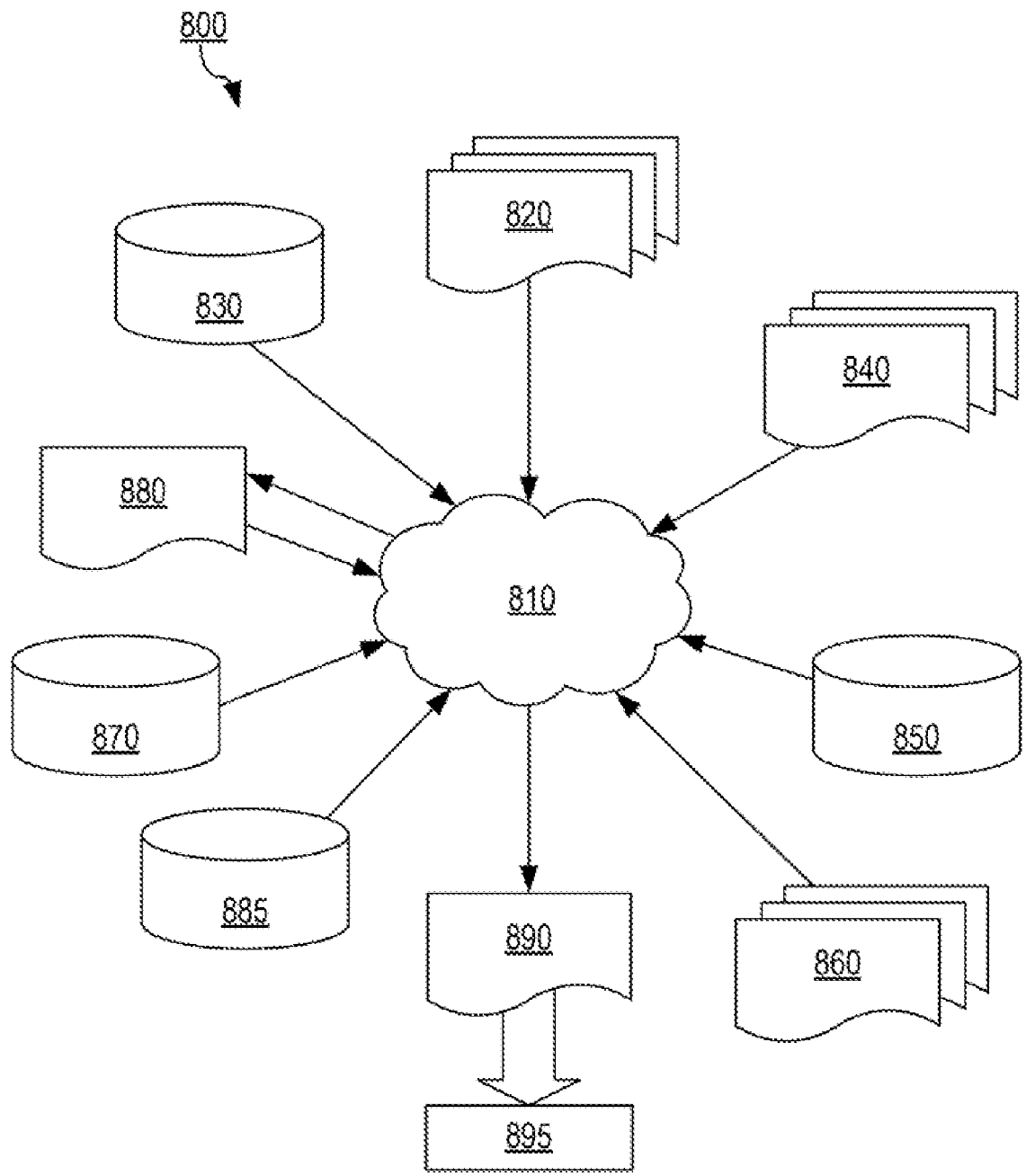
FIG. 8 is an example flow diagram of a design process used in semiconductor design, manufacture, and/or test in which aspects of the illustrative embodiments may be implemented.

FIG. 8 shows a block diagram of an exemplary design flow 800 used for example, in semiconductor design, manufacturing, and/or test, in which the illustrative embodiments may be utilized. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 may be generated using the mechanisms of the illustrative embodiments described above in the form of schematics or HDL, a hardware-description language (e.g., Verilog, VHDL, C, etc.). Design structure 820 may be contained on one or more machine readable medium. For example, design structure 820 may be a text file or a graphical representation of an integrated circuit device or the like generated and refined using the mechanisms of the illustrative embodiments. Design process 810 preferably synthesizes (or translates) the design into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. These processes, such as verification, synthesis, and the like, may be augmented to include the refinement mechanisms of the illustrative embodiments described above. One of ordinary skill in the art of integrated circuit design can appreciate the extent of possible electronic design automation tools and applications used in design process 810 without deviating from the scope and spirit of the invention.

Design process 810 preferably translates an integrated circuit device or the like, along with any additional integrated circuit design or data (if applicable), into a second design structure 890. Design structure 890 resides on a storage medium in a data format used for the exchange of layout data of integrated circuits (e.g. information stored in a GDSII (GDS2), GL1, OASIS, or any other suitable format for storing such design structures). Design structure 890 may comprise information such as, for example, test data files, design content files, manufacturing data, layout parameters, wires, levels of metal, vias, shapes, data for routing through the manufacturing line, and any other data required by a semiconductor manufacturer to produce an integrated circuit device or the like. Design structure 890 may then proceed to a stage 895 where, for example, design structure 890: proceeds to tapeout, is released to manufacturing, is released to a mask house, is sent to another design house, is sent back to the customer, etc.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising a processor and a memory, for refining an abstraction of a netlist for verification or synthesis of an integrated circuit design, comprising:

receiving, in the data processing system, an abstracted netlist corresponding to an original netlist of the integrated circuit design;

determining, by the data processing system, elements, of an array of elements in the integrated circuit design, already present in the abstracted netlist;

refining, by the data processing system, the abstracted netlist by expanding the abstracted netlist to include additional elements, of the array of elements, that are correlated with the elements already present in the abstracted netlist to thereby generate a refined abstracted netlist; and utilizing, by the data processing system, the refined abstracted netlist to perform at least one of verification or synthesis of the integrated circuit design, wherein the additional elements that are correlated with the elements already present in the abstracted netlist comprise additional elements, in the array of elements in the integrated circuit design, having a same row or column location in the array of elements as elements already present in the abstracted netlist.

2. The method of claim 1, wherein the additional elements are additional gates selected based on a criteria of minimizing a total number of referenced columns and rows in the refined abstracted netlist.

3. The method of claim 1, wherein refining the abstracted netlist further comprises eliminating portions of an array in the abstracted netlist that are not referenced during the verification or synthesis of the integrated circuit design.

4. The method of claim 1, wherein refining the abstracted netlist comprises:
deriving a set of candidate refinement gates as a set of cutpointed gates assigned a predetermined Boolean value in a spurious failure trace of the abstracted netlist; and
identifying a subset of elements of the set of candidate refinement gates that correlates to array cells having a same row and same column as elements in the abstracted netlist.

5. The method of claim 4, wherein refining the abstracted netlist further comprises:
determining if the subset of elements of the set of candidate refinement gates is empty; and
in response to the subset of elements of the set of candidate refinement gates being empty, selecting a criterion of either "same rows" or "same columns" for selection of a subset of elements from the candidate refinement gates having a characteristic corresponding to the selected criterion with regard to elements already present in the abstracted netlist.

6. The method of claim 1, wherein refining the abstracted netlist further comprises:
identifying rows of an array in the abstracted netlist that are not referenced during the verification or synthesis; and
reducing address pins associated with the array in response to identifying rows in the array that are not referenced during the verification or synthesis.

7. The method of claim 6, wherein identifying rows of an array in the abstracted netlist that are not referenced during the verification or synthesis comprises determining if no even numbered row in the array is referenced during the verification or synthesis, and wherein reducing address pins associated with the array comprises, in response to no even numbered row in the array being referenced during the verification or synthesis, dropping a least-significant address pin from the array.

8. The method of claim 6, wherein reducing the address pins comprises:
determining if a number of rows of the array referenced during the verification or synthesis is half or less of 2 to the power of the number of address pins of the array; and
reducing a number of address pins by permuting an address space of the array to pack the remaining relevant rows by forming a bijection between the original rows of the array in the original netlist and post abstraction rows of the array.

9. The method of claim 1, wherein refining the abstracted netlist comprises:
deriving a set of candidate refinement gates;
generating a new abstracted netlist having only non-array related gates from the abstracted netlist and the set of refinement gates;
generating a set of gates representing a remainder of the abstracted netlist and the set of refinement gates that are not included in the new abstracted netlist;
determining if a column of an array in the new abstracted netlist has no modeled cells in a set of array cells already included in the abstracted netlist or the set of candidate refinement gates; and
replacing an array in the new abstracted netlist with an array that does not include the column having no modeled cells in the set of array cells already included in the abstracted netlist or the set of candidate refinement gates.

10. A computer program product comprising a computer readable storage medium having a computer readable program stored therein, wherein the computer readable program, when executed on a computing device, causes the computing device to:
receive an abstracted netlist corresponding to an original netlist of an integrated circuit design;
determine elements, of an array of elements in the integrated circuit design, already present in the abstracted netlist;
refine the abstracted netlist by expanding the abstracted netlist to include additional elements, of the array of elements, that are correlated with the elements already present in the abstracted netlist to thereby generate a refined abstracted netlist; and
utilize the refined abstracted netlist to perform at least one of verification or synthesis of the integrated circuit design, wherein the additional elements that are correlated with the elements already present in the abstracted netlist comprise additional elements, in the array of elements in the integrated circuit design, having a same row or column location in the array of elements as elements already present in the abstracted netlist.

11. The computer program product of claim 10, wherein the additional elements are additional gates selected based on a criteria of minimizing a total number of referenced columns and rows in the refined abstracted netlist.

12. The computer program product of claim 10, wherein refining the abstracted netlist further comprises eliminating portions of an array in the abstracted netlist that are not referenced during the verification or synthesis of the integrated circuit design.

13. The computer program product of claim 10, wherein refining the abstracted netlist comprises:
deriving a set of candidate refinement gates as a set of cutpointed gates assigned a predetermined Boolean value in a spurious failure trace of the abstracted netlist; and
identifying a subset of elements of the set of candidate refinement gates that correlates to array cells having a same row and same column as elements in the abstracted netlist.

14. The computer program product of claim 13, wherein refining the abstracted netlist further comprises:
determining if the subset of elements of the set of candidate refinement gates is empty; and in response to the subset of elements of the set of candidate refinement gates being empty, selecting a criterion of either "same rows" or "same columns" for selection of a subset of elements from the candidate refinement gates having a characteristic corresponding to the selected criterion with regard to elements already present in the abstracted netlist.

15. The computer program product of claim 10, wherein refining the abstracted netlist further comprises:
identifying rows of an array in the abstracted netlist that are not referenced during the verification or synthesis; and
reducing address pins associated with the array in response to identifying rows in the array that are not referenced during the verification or synthesis.

16. The computer program product of claim 15, wherein identifying rows of an array in the abstracted netlist that are not referenced during the verification or synthesis comprises determining if no even numbered row in the array is referenced during the verification or synthesis, and wherein reducing address pins associated with the array comprises, in response to no even numbered row in the array being referenced during the verification or synthesis, dropping a least-significant address pin from the array.

17. The computer program product of claim 15, wherein reducing the address pins comprises:
determining if a number of rows of the array referenced during the verification or synthesis is half or less of 2 to the power of the number of address pins of the array; and
reducing a number of address pins by permuting an address space of the array to pack the remaining relevant rows by forming a bijection between the original rows of the array in the original netlist and post abstraction rows of the array.

18. The computer program product of claim 10, wherein refining the abstracted netlist comprises:
deriving a set of candidate refinement gates;
generating a new abstracted netlist having only non-array related gates from the abstracted netlist and the set of refinement gates;
generating a set of gates representing a remainder of the abstracted netlist and the set of refinement gates that, are not included in the new abstracted netlist;
determining if a column of an array in the new abstracted netlist has no modeled cells in a set of array cells already included in the abstracted netlist or the set of candidate refinement gates; and
replacing an array in the new abstracted netlist with an array that does not include the column having no modeled cells in the set of array cells already included in the abstracted netlist or the set of candidate refinement gates.

19. An apparatus, comprising:
a processor; and
a memory coupled to the processor, wherein the memory comprises instructions which, when executed by the processor, cause the processor to:
receive an abstracted netlist corresponding to an original netlist of an integrated circuit design;
determine elements, of an array of elements in the integrated circuit design, already present in the abstracted netlist;
refine the abstracted netlist by expanding the abstracted netlist to include additional elements, of the array of elements, that are correlated with the elements already present in the abstracted netlist to thereby generate a refined abstracted netlist; and
utilize the refined abstracted netlist to perform at least one of verification or synthesis of the integrated circuit design, wherein the additional elements that are correlated with the elements already present in the abstracted netlist comprise additional elements, in the array of elements in the integrated circuit design, having a same row or column location in the array of elements as elements already present in the abstracted netlist.

20. The apparatus of claim 19, wherein the additional elements are additional gates selected based on a criteria of minimizing a total number of referenced columns and rows in the refined abstracted netlist.

21. The apparatus of claim 19, wherein refining the abstracted netlist further comprises eliminating portions of an array in the abstracted netlist that are not referenced during the verification or synthesis of the integrated circuit design.

22. The apparatus of claim 19, wherein refining the abstracted netlist comprises:
deriving a set of candidate refinement gates as a set of cutpointed gates assigned a predetermined Boolean value, in a spurious failure trace of the abstracted netlist;
identifying a subset of elements of the set of candidate refinement gates that correlates to array cells having a same row and same column as elements in the abstracted netlist;
determining if the subset of elements of the set of candidate refinement gates is empty; and
in response to the subset of elements of the set of candidate refinement gates being empty, selecting a criterion of either "same rows" or "same columns" for selection of a subset of elements from the candidate refinement gates having a characteristic corresponding to the selected criterion with regard to elements already present in the abstracted netlist.

* * * * *